United States Patent
Atehortua et al.

(10) Patent No.: US 7,471,090 B2
(45) Date of Patent: Dec. 30, 2008

(54) METHOD FOR DETERMINING CAPACITY OF LEAD-ACID BATTERIES OF VARIOUS SPECIFIC GRAVITIES

(75) Inventors: Hector M. Atehortua, North Bergen, NJ (US); Steven Hoenig, Staten Island, NY (US); Thirumalai G. Palanisamy, Morristown, NJ (US); Harmohan N. Singh, Rockaway, NJ (US)

(73) Assignee: Honeywell International Inc., Morristown, NJ (US)

( * ) Notice: Subject to any disclaimer, the term of this patent is extended or adjusted under 35 U.S.C. 154(b) by 357 days.

(21) Appl. No.: 11/094,444

(22) Filed: Mar. 31, 2005

(65) Prior Publication Data

US 2006/0226845 A1    Oct. 12, 2006

(51) Int. Cl.
*G01N 27/416* (2006.01)
(52) U.S. Cl. .................. 324/427; 320/132; 324/426
(58) Field of Classification Search ............... 320/134; 324/426, 427
See application file for complete search history.

(56) References Cited

U.S. PATENT DOCUMENTS

| 4,626,765 | A | * | 12/1986 | Tanaka | 320/127 |
| 5,049,803 | A | * | 9/1991 | Palanisamy | 320/132 |
| 6,618,681 | B2 | | 9/2003 | Hoenig | |
| 2002/0193953 | A1 | * | 12/2002 | Hoenig et al. | 702/63 |
| 2005/0052158 | A1 | | 3/2005 | Meissner | |
| 2005/0270033 | A1 | | 12/2005 | Singh et al. | |

FOREIGN PATENT DOCUMENTS

| DE | 10208651 A1 | 1/2003 |
| JP | 2004260905 A | 12/2003 |
| WO | 03085772 A1 | 10/2003 |

OTHER PUBLICATIONS

W. H. Edwards, A. I. Harrison and T. M. Wolstenholme "Conductance measurements in relation to battery state of charge" from the proceeding of the Telecommunications Energy Conference, 1999, INTELEC '099, Section 18-3.*
International Search Report dated Jul. 25, 2006.

* cited by examiner

*Primary Examiner*—Akm E Ullah
*Assistant Examiner*—Ramy Ramadan
(74) *Attorney, Agent, or Firm*—Oral Cagler, Esq.

(57) ABSTRACT

In accordance with various embodiments, there is a method for determining the capacity of a battery. Various embodiments include applying a predetermined current ramp to a fully charged lead-acid battery while measuring a battery terminal voltage. An $I_{up}$ can be determined, where the $I_{up}$ is a transition from charging to overcharging. A specific gravity of the lead-acid battery can also be determined. The capacity of the lead-acid battery can then be determined from the $I_{up}$ using a correlation function that describes the relationship of the $I_{up}$ to the capacity, where the correlation function depends on the specific gravity of the lead-acid battery.

8 Claims, 5 Drawing Sheets

METHOD FOR DETERMINING CAPACITY OF LEAD-ACID BATTERIES OF VARIOUS SPECIFIC GRAVITIES

FIELD OF THE INVENTION

The invention generally relates to methods and apparatus for determining the capacity of a battery and, more particularly to methods and apparatus for determining the capacity of batteries with various specific gravities.

BACKGROUND OF THE INVENTION

It is often desirable to determine the capacity of a battery, usually measured in amp-hours (Ah), for reliable operation of battery powered devices. One conventional method for determining the capacity of a battery, for example, a lead-acid battery, requires fully charging the battery to 100% state of charge (SOC) and then fully discharging the battery at a constant current. The battery capacity is determined by multiplying the discharge current by the discharge time needed to fully discharge the battery. Following the discharge to determine its capacity, the battery must be fully charged again to be ready for use. This conventional method is time consuming and may be destructive of the battery's health, as gassing may occur in overcharging the battery and cause damage.

To address the need to charge and discharge the battery to determine capacity, another conventional method uses a correlation of $I_{up}$ to capacity. $I_{up}$ is the local maximum of the slope of the battery terminal voltage in response to the increasing portion of a current ramp. $I_{up}$ corresponds to the transition from a charge reaction to an overcharge reaction. In lead-acid batteries, the overcharge reaction is generation of hydrogen and oxygen gas, $2H_2O \leftrightarrow 2H_2+O_2$. For example, a linearly increasing current ramp is applied to a lead-acid battery while measuring the battery terminal voltage. Upon reaching a predetermined voltage safe limit, a linearly decreasing current ramp is applied while measuring battery terminal voltage. The slope of the voltage response is then calculated and the local maximums determined. The local maximum during the increasing portion of the current ramp $I_{up}$ is then correlated to battery capacity.

This conventional method is limited, however, to use on lead-acid batteries having a full charge specific gravity (SG) of 1.28. Specific gravity of the battery refers to a ratio of the density of the battery's electrolyte to the density of water. Problems arise because recently introduced lead-acid batteries have a full charge specific gravity of 1.30. Because the conventional methods and apparatus for determining capacity cannot distinguish between the lower specific gravity batteries (1.28 SG) and the higher specific gravity batteries (1.30 SG), incorrect capacity determination results when using the higher specific gravity batteries with conventional methods and apparatus.

Thus, there is a need to overcome these and other problems of the prior art and to provide better methodology and apparatus to determine battery capacity.

SUMMARY OF THE INVENTION

In accordance with various embodiments, there is a method for determining the capacity of a lead-acid battery including applying a predetermined current ramp to a fully charged lead-acid battery while measuring a battery terminal voltage. An $I_{up}$ can be determined, wherein the $I_{up}$ is a transition current from charging to overcharging and a specific gravity of the lead-acid battery can be determined. The capacity of the lead-acid battery can then be determined from the $I_{up}$ using a correlation function that describes the relationship of the $I_{up}$ to the capacity, wherein the correlation function depends on the specific gravity of the lead-acid battery.

In accordance with various other embodiments, there is an apparatus for determining a capacity of a lead-acid battery that can include a power supply. The apparatus can further include a control module comprising an analog-to-digital converter, a digital-to-analog converter, and an electronics control system, wherein the control module controls the power supply to apply a current to a lead-acid battery. The apparatus can further include a control relay electrically connected to the power supply and a sensor that detects a battery voltage response to a current ramp, the sensor electrically connected to the control relay. The apparatus can also include a processor configured to determine $I_{up}$, where $I_{up}$ is a current at a gassing point, where the processor can be further configured to determine a capacity of the lead-acid battery based on the $I_{up}$ and a specific gravity of the lead-acid battery.

In accordance with still other embodiments, there is computer readable medium for determining a capacity of a battery. The computer readable medium can include program code for applying a current ramp to a fully charged battery and program code for measuring an battery terminal voltage response to the current ramp. The computer readable medium can further include program code for determining an $I_{up}$, wherein the $I_{up}$ is a transition from charging to overcharging and program code for determining a specific gravity of the lead-acid battery. The computer readable medium can further include program code for determining the capacity of the lead-acid battery from the $I_{up}$ using a correlation function, wherein the correlation function depends on the specific gravity of the lead-acid battery.

It is to be understood that both the foregoing general description and the following detailed description are exemplary and explanatory only and are not restrictive of the invention, as claimed.

The accompanying drawings, which are incorporated in and constitute a part of this specification, illustrate several embodiments and together with the description, serve to explain the principles of the invention.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

FIGS. 1-6 disclose, generally, apparatus and methods for determining the capacity of a battery, such as, for example, a lead-acid battery having a capacity of about 25 Ah to about 125 Ah. The disclosed exemplary methods and apparatus allow the capacity of the battery to be determined without having to discharge the battery. Furthermore, the disclosed exemplary methods and apparatus allow the capacity to be determined for batteries of various specific gravities.

Figure 1:
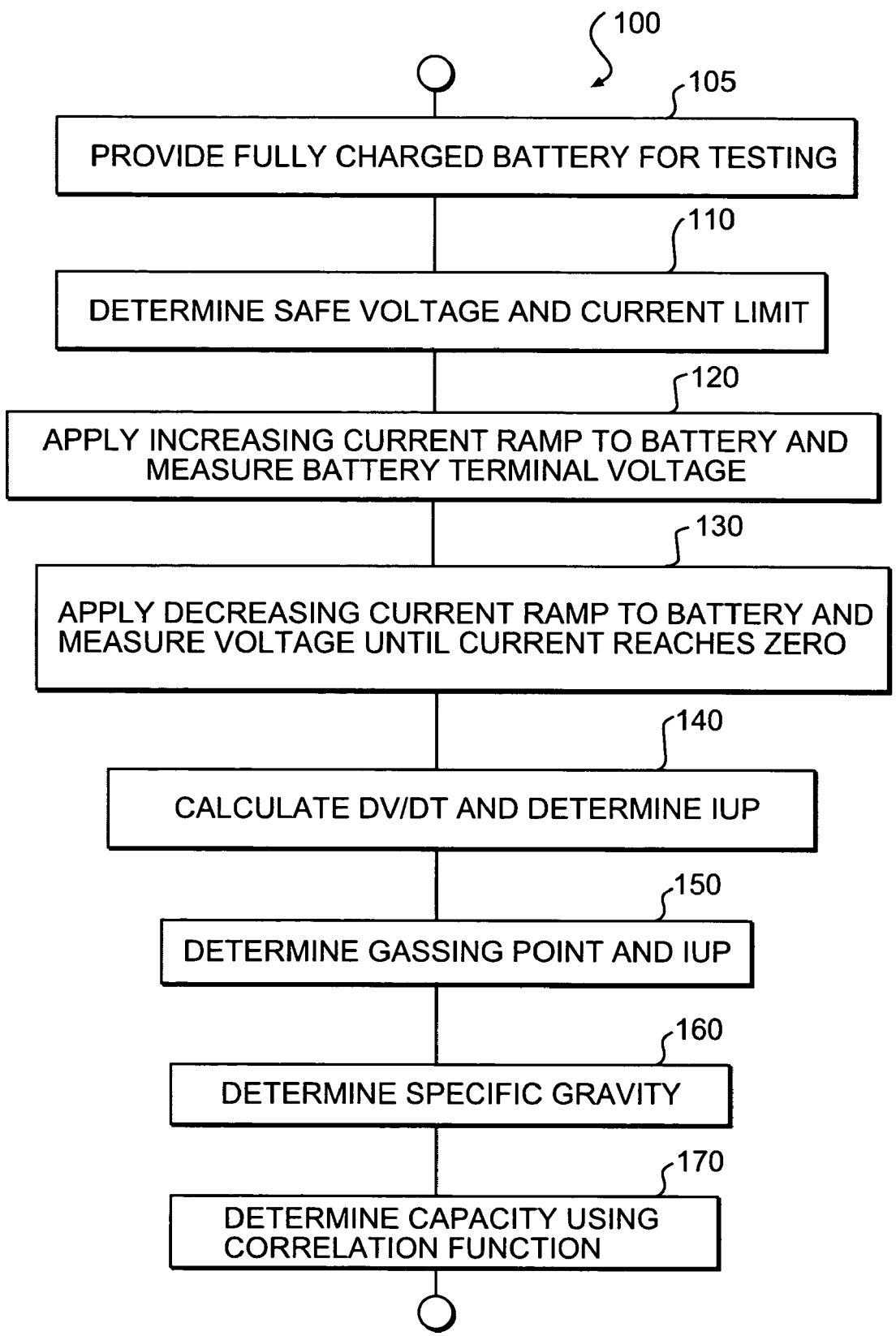
FIG. 1 depicts a flow chart of a method for determining the capacity of a battery in accordance with exemplary embodiments of the present teachings.

FIG. 1 depicts an exemplary flow chart of a method 100 to determine the capacity of a battery, such as, for example, a lead-acid battery having at least one cell. At 105, a fully charged battery can be provided for which capacity will be determined. In various embodiments, providing the fully charged battery can include charging the battery to 100% state of charge (SOC). Charging to 100% SOC can be accomplished by techniques known to one of ordinary skill in the art, such as, for example, using a Honeywell TruCharge™ analyzer/charger.

At 110, a safe voltage and a current limit can be determined for the battery. The safe voltage and current limit can be established from known battery characteristics. In some instances, this information may be provided by the battery manufacturer.

As shown at 120, an increasing current ramp can be applied to the battery while battery voltage is measured in real time at the battery terminals. In certain embodiments, the current ramp can have a predetermined slope, such as a linearly increasing current ramp. The current ramp can be increased to a predetermined value, such as the safe voltage, and then decreased at the same slope while the battery voltage is measured in real time. As shown at 130, the current is decreased until the current is zero. Measuring the battery voltage provides a response voltage (V) of the battery to the applied current.

Figure 2:
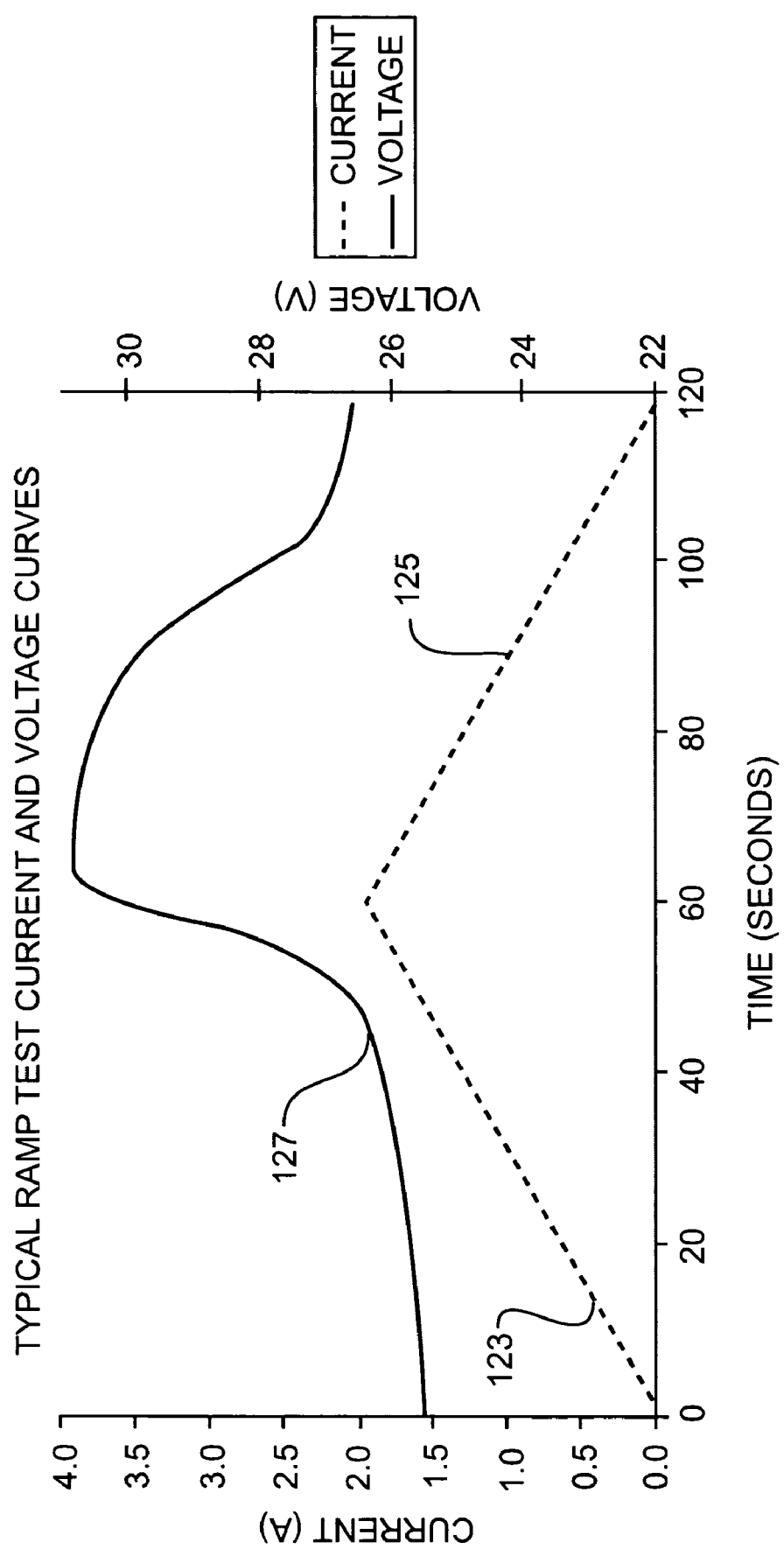
FIG. 2 is a graph showing an exemplary linearly increasing and decreasing current ramp applied to a battery and a measured voltage response of the battery.

At 140, the slope of the response voltage (dV/dt) can be determined and recorded along with the measured applied current and voltage response data. In order to provide an illustrative example, FIG. 2 depicts an exemplary current ramp and the measured voltage response. It is to be understood, however, that the embodiment shown in FIG. 2 is not to be limiting but is used as an illustrative tool for understanding various embodiments. Accordingly, FIG. 2 depicts a battery test cycle including a current ramp, and the voltage response of a battery that exhibits at least one gassing point. The embodiment shown in FIG. 2 depicts a linearly increasing current ramp 123 applied for approximately 60 seconds from 0.0 amps (A) to approximately 2.0 (A). Subsequently, a linearly decreasing current ramp 125 is applied for approximately 60 seconds until the current reaches 0.0 (A). A voltage response 127 depicted in FIG. 2 shows that the voltage increases for more than 60 seconds and then begins to fall after reaching a maximum value.

Figure 3:
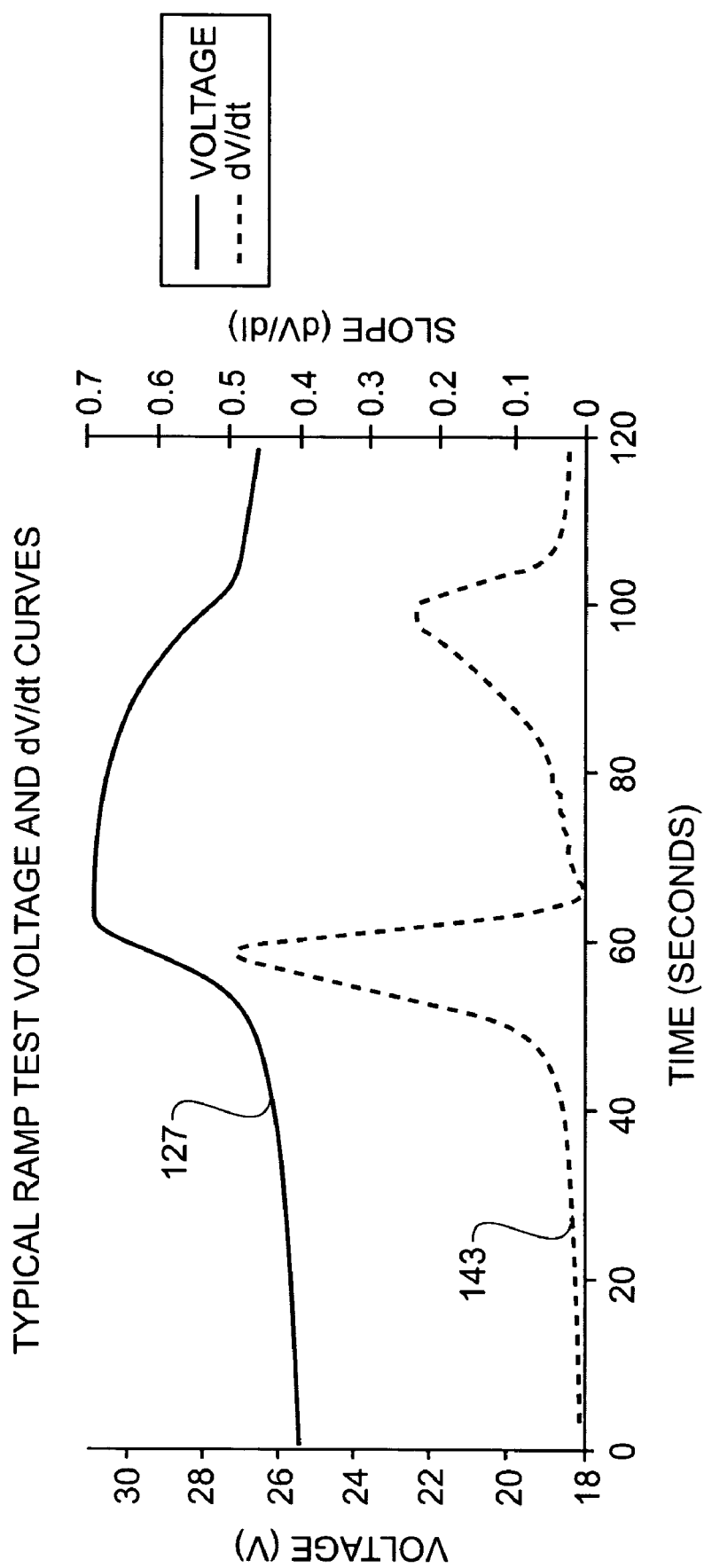
FIG. 3 is a graph showing the measured voltage response of a battery to an exemplary linearly increasing and decreasing current ramp and the slope of the voltage response (dV/dt).

In various embodiments, the slope of the response voltage (dV/dt) can be determined by calculating the difference in successive voltage data points received in the real time measurement of the battery voltage over small time intervals. An appropriate smoothing program known to one of ordinary skill in the art can be applied to the result of the calculation to reduce or eliminate noise caused by the measurement system. FIG. 3 depicts (dV/dt), shown as 143, determined for the voltage response curve 127 shown in FIG. 2. The voltage response 127 is also reproduced as the upper curve in FIG. 3.

Referring again to FIG. 1, the presence of a gassing point and $I_{up}$ can be determined at 150. Generally, a gas point occurs when the battery's response to the applied current ramp switches from primarily a gassing charging response to primarily a charging gassing response. The gassing point can be determined by calculating the local maximum values of the (dV/dt) curve. For example, the slope going through a maximum can indicate the transition from a charge reaction to an overcharge reaction in the increasing current ramp, and a transition from an overcharge reaction to a charge reaction in the decreasing current ramp. The current and voltage at which this occurs are referred to, respectively, as the gas current ($I_{gas}$) and the gas voltage ($V_{gas}$). A battery response to the cycle can exhibit a (dV/dt) maximum on both the increasing and decreasing portion of the current ramp. The current and the voltage values corresponding to the transition point on the increasing portion of the ramp are referred to as ($I_{up}$) and ($V_{up}$), while those values on the decreasing portion of the ramp are referred to as ($I_{down}$) and ($V_{down}$).

At 160, a specific gravity (SG) of the battery can be determined. As used herein, the terms "specific gravity" and "battery specific gravity" refer to the specific gravity of the electrolyte of the battery. The specific gravity of the battery can be determined by invasive techniques, such as, for example, extracting a sample of electrolyte from the battery. The specific gravity can also be determined by examining documentation on the battery's specifications. According to various embodiments, the specific gravity can also be determined non-invasively, as disclosed for example in U.S. patent application Ser. No. 10/860,315, filed on Jun. 4, 2004, and incorporated by reference in its entirety herein.

At 170, the capacity of the battery can be determined using a correlation function that describes the relationship between $I_{up}$ and capacity and is dependent on the specific gravity (SG) of the battery. For example, for a lower SG battery having a specific gravity of 1.28, the capacity can be determined by:

$$\text{Capacity}_L = (I_{up} \times 28.95) - 36.97 \quad (1)$$

where $\text{Capacity}_L$ is the capacity of the lower specific gravity (1.28) battery measured, for example, in Ah.

Figure 4:
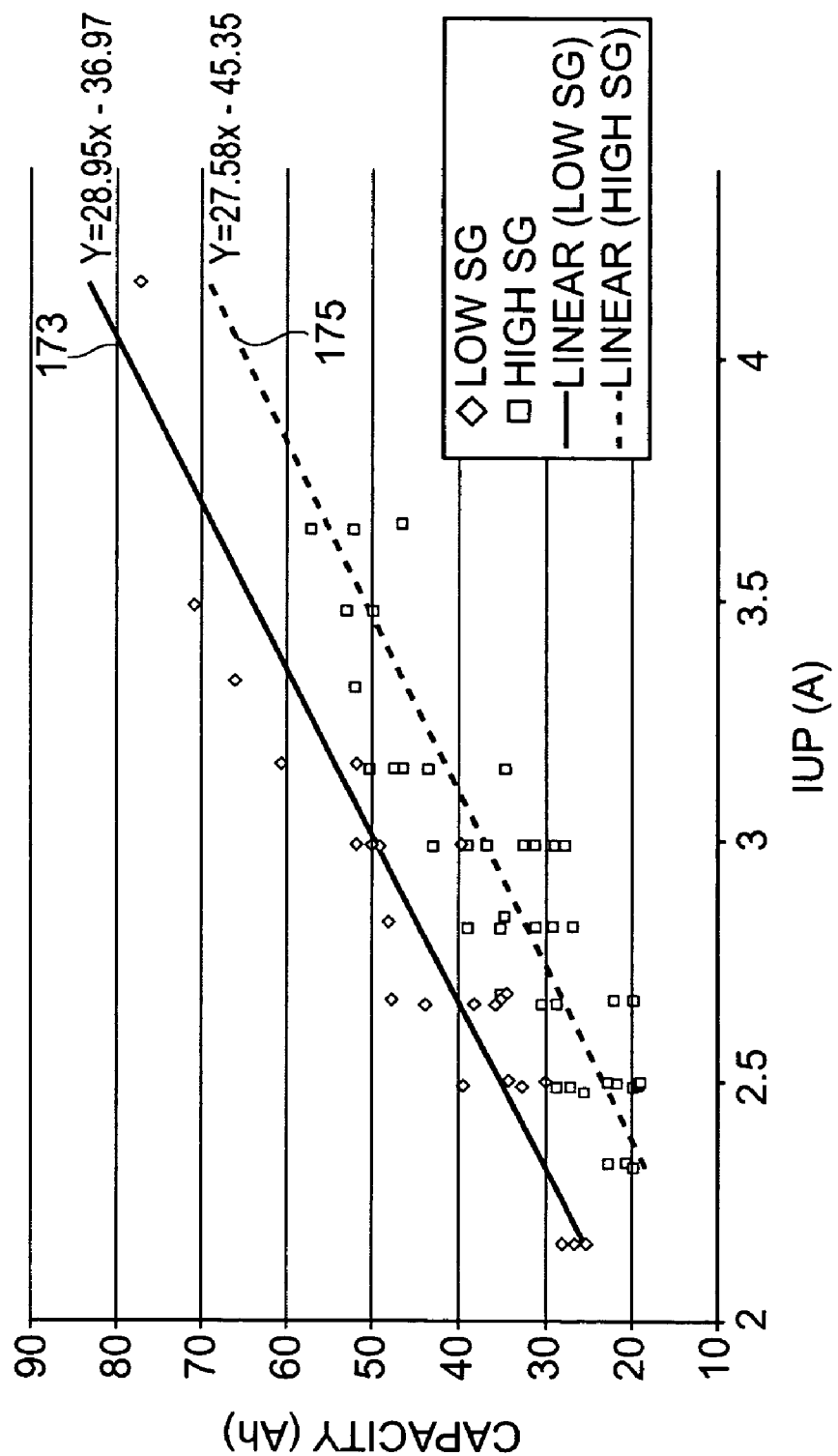
FIG. 4 is a graph showing the correlation function between battery capacity and $I_{up}$ for a high SG battery and a low SG battery.

Similarly, the capacity of a higher SG battery having a specific gravity of 1.30 can be determined by:

$$\text{Capacity}_H = (I_{up} \times 27.58) - 45.35 \quad (2)$$

where $\text{Capacity}_H$ is the capacity of the higher specific gravity (1.30) battery measured, for example, in Ah. FIG. 4 shows a graph of the linear relationship between $I_{up}$ and capacity for a high SG lead acid battery (173) and a low SG lead-acid battery (175) for a current ramp having a slope of about 1A/3 sec. and similar in form to that shown in FIG. 2. One of skill in the art understands that test parameters, such as, for example, current ramp slope can be changed to a limited degree and that changes in test parameters can change the generated correlation function. Due to the non-linearity of the ramp test, however, changes in test parameters may not have a proportional effect on the changes in the test response and the generated correlation function.

Although the above-described exemplary embodiment correlates capacity to $I_{up}$ for a lower specific gravity (1.28) battery and a higher specific gravity (1.30) battery, one of skill in the art will understand that the exemplary methodology can be applied to batteries of other specific gravities by generating a correlation function. According to various embodiments, the correlation function can be generated by selecting a battery of known specific gravity, performance capacity, and acceptable state of health. In various embodiments, batteries with acceptable health can have no detectable defects. Further, in various embodiments, batteries with known capacity can be batteries with a measured discharge capacity from three consecutive discharges.

In various embodiments, data for determining the relationship between Iup and capacity can be generated by establishing a consistent discharge capacity for several batteries within a test group by averaging three discharge cycle results. For example, three cycles on each battery in the test group can be performed. A cycle can include: (i) charging the battery to 100% SOC; (ii) performing a ramp test and recording $I_{up}$; (iii) performing a full discharge and recoding the discharge capacity; and (iv) compiling the recorded $I_{up}$ and discharge capacity data for all batteries in the test group and for all cycles performed. Using the complied data, the relationship between Iup and capacity can be mathematically derived.

Figure 5:
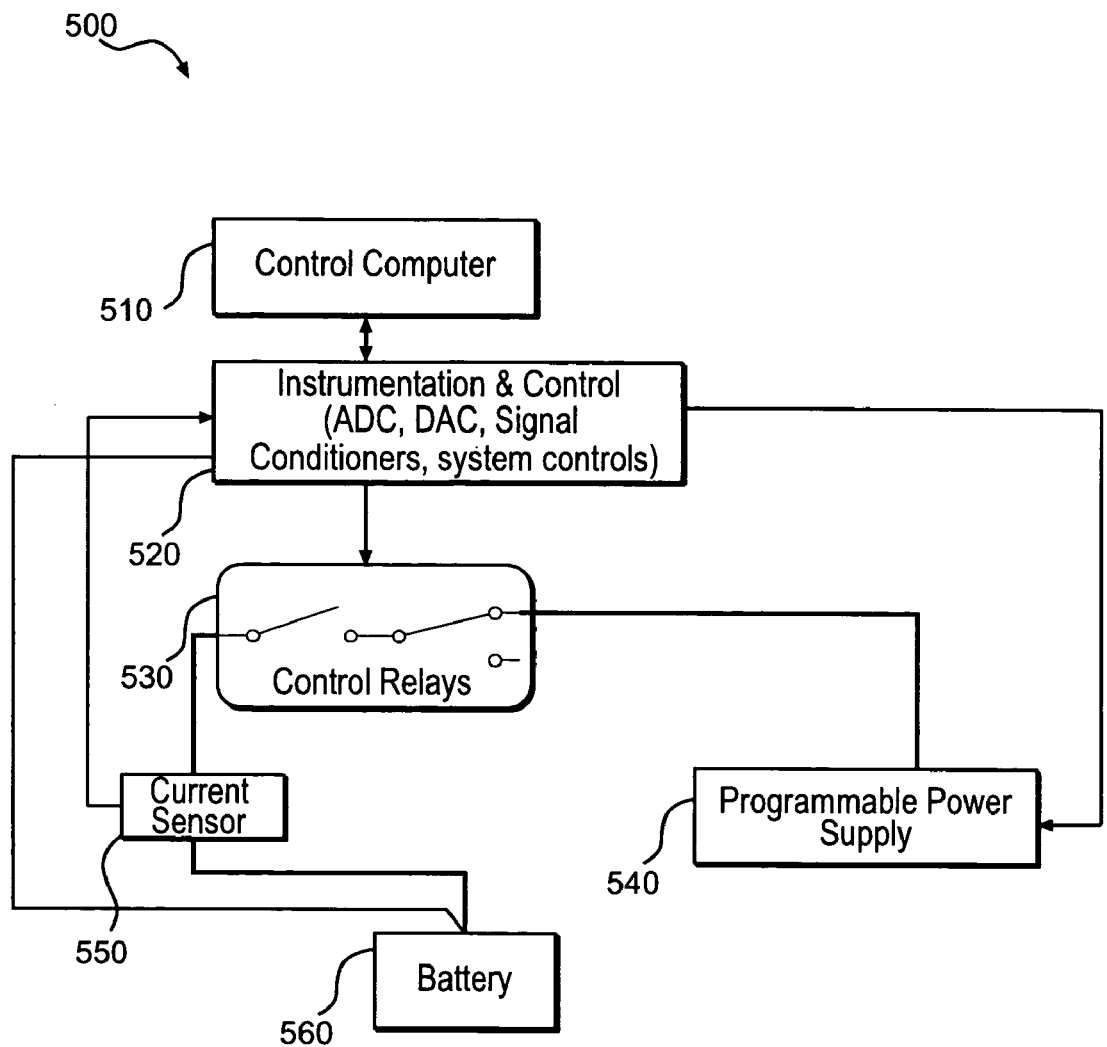
FIG. 5 depicts a block diagram of a system capable of determining the capacity of a battery in accordance with an exemplary embodiment.

FIG. 5 depicts an exemplary configuration of a system 500 that can determine the capacity of a battery. The exemplary system 500 can include various modules, such as a control computer 510, an instrumentation and control module 520, a control relay 530, a programmable power supply 540, and a current sensor 550. Also shown in FIG. 5 is a battery 560, such as a lead-acid battery, for which capacity can be determined.

In various embodiments, control computer 510 can include a set of capacity measurements algorithms. Control computer 510 can also include software drivers that can be used to control other modules of the exemplary system.

Control computer 510 can be connected to instrumentation and control module 520. Control computer 510 can be any suitable computer such as, for example, a Pentium computer with a National Instruments data acquisition module installed therein. In various embodiments instrumentation and control module 520 can include an analog-to-digital converter (ADC), a digital-to-analog converter (DAC), and an electronic control signal generator (ECSG). Instrumentation and control module 520 can be, for example, a National Instruments signal conditioning system. The ADC and DAC process information input into the instrumentation and control module 520 and coordinate with the ECSG to operate the other modules in system 500. For example, the ADC, the DAC, and the ECSG can control relay 530, and/or programmable power supply 540. Programmable power supply 540 can be, for example, a Hewlett-Packard model 6032A power supply. Programmable power supply 540, in conjunction with instrumentation and control module 520, can apply a current ramp, such as an increasing or decreasing current ramp of predetermined slopes, to battery 560. In various arrangements, programmable power supply 540 and/or instrumentation and control module 520 can include computer software that controls the slope of the current ramp.

In various embodiments, control relay 530 can be used to connect battery 560, whose capacity is to be determined, to programmable power supply 540. For example, instrumentation and control module 520 can control the control relay 530 by applying a contact closure control signal over a line to switch battery 560 in and out of the circuit. When relay 530 is open, battery 560 is taken out of the circuit and no current is applied. When relay 530 is closed, battery 560 is in the circuit and a current can be applied. Current sensor 550, such as a current shunt, can be placed in a series with battery 560. An exemplary current sensor 550 can include, for example, a 50-amp/50-millivolt shunt connected to a channel of the ADC. The 50-amp/50-millivolt shunt selection is exemplary of batteries where currents up to 50-amps may be encountered. The shunt selection can be performed to result in measurement sensitivity suitable for the battery being tested. Other suitable techniques can also be used to measure current, such as a Hall effect device. The sensed voltage, an analog quantity, can be converted to digital form by ADC in instrumentation and control module 520. The digital data of these parameters can be supplied to control computer 510. In this manner, current sensor 550 can be used to measure the amount of current going to, or coming from, battery 560. This can be performed by measuring the voltage drop across the current shunt and dividing the voltage drop by the shunt resistance.

Various embodiments include a computer controllable medium. For example, embodiments can include a power supply control program that can control the amount of current supplied to the battery. The power supply control program can be stored in at least one of control computer 510, instrumentation and control module 520, and programmable power supply 540. The power supply control program can include subroutines that direct power supply 540 to apply an increasing current ramp to battery 560.

Various embodiments can include a current sensor program code that can control current sensor 550. The current sensor program code can be stored in at least one of control computer 510, instrumentation and control module 520, and current sensor 550. The current sensor program can determine when current sensor 550 should measure the battery current. For example, when the power source program code directs power supply 540 to apply a current ramp, such as an increasing or decreasing current ramp, to battery 560, the current sensor program can determine that current sensor 550 should measure the voltage drop across the current sensor 550. Information about the measured voltage drop can be analyzed by instrumentation and control module 520 to yield the battery current. Instrumentation and control module 520 can also determine the battery voltage directly by measuring the voltage across the positive and negative battery terminals.

Various embodiments include a processor control program that can determine a capacity of battery 560. The processor control program can be stored in at least one of control computer 510 and instrumentation and control module 520. The processor control program can receive information from power supply 540, current sensor 550, and the battery 560. The received information can be processed and compared to a diagram, such as, for example, FIG. 3, or used in a correlation function to determine the capacity of battery 560.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of determining a capacity of a lead-acid battery comprising:
    providing a lead-acid battery having at least one cell;
    fully charging the lead-acid battery;
    applying a predetermined current ramp to the fully charged lead-acid battery while measuring a battery terminal voltage comprising
        applying a linearly increasing current ramp to the lead-acid battery while measuring a battery terminal voltage, wherein the increasing current ramp has a slope and applying a decreasing current ramp to the lead-acid battery while measuring a battery terminal voltage after the battery terminal voltage reaches a safe limit, wherein the decreasing current ramp has a same slope as an absolute value of the increasing current ramp, wherein the slope of the linearly increasing current ramp is about 0.33 A/sec;
    calculating an $I_{up}$, wherein the $I_{up}$ is a transition current from charging to overcharging;
    determining a battery specific gravity of the lead-acid battery; and
    calculating the capacity of the lead-acid battery dependent upon the determined battery specific gravity using a correlation function, wherein the correlation function is Capacity=$(I_{up} \times 27.58) - 45.35$ when the full charge specific gravity is about 1.30 or Capacity=$(I_{up} \times 28.95) - 36.97$ when the battery specific gravity is about 1.28.

2. The method of claim 1, wherein determining an $I_{up}$ comprises:
   - calculating a slope (dV/dt) of the battery terminal voltage in response to the increasing current ramp and the decreasing current ramp; and
   - determining $I_{up}$, where $I_{up}$, is a current corresponding to a local maximum of the slope of the battery terminal voltage.

3. The method of claim 1, further comprising determining the correlation function for a known full charge specific gravity.

4. The method of claim 1, further comprising determining the correlation function for another predetermined slope.

5. A computer readable medium for determining a capacity of a battery, the computer readable medium comprising:
   - program code for determining when a lead-acid battery is fully charged;
   - program code for applying a current ramp to the fully charged lead-acid battery;
   - program code for measuring an battery terminal voltage response to the current ramp;
   - program code for calculating an $I_{up}$, wherein the $I_{up}$ is a transition from charging to overcharging;
   - program code for determining a battery specific gravity of the lead-acid battery; and
   - program code for calculating the capacity of the lead-acid battery dependent upon the determined battery specific gravity; wherein the current ramp is about 0.33 A/sec, wherein the program code for calculating the capacity includes coding for a correlation function wherein the correlation function is Capacity=$(I_{up} \times 27.58) - 45.35$ when the battery specific gravity is about 1.30 or Capacity=$(I_{up} \times 28.95) - 36.97$ when the battery specific gravity is about 1.28.

6. The computer readable medium of claim 5, wherein the program code for determining a full charge specific gravity of the lead-acid battery comprises:
   - program code for detecting gas points;
   - program code for calculating a maximum voltage per cell of the battery; and
   - program code for comparing a maximum battery voltage detected in the battery voltage response to the current ramp divided by the number of cells of the battery, to an $SG_{Lim}$, where the $SG_{Lim}$ is an upper limit of a maximum measured battery voltage of a low full charge specific gravity battery divided by the number of cells of the low full charge specific gravity battery.

7. The computer readable medium of claim 5, further comprising program code for indicating the capacity of the battery.

8. The computer readable medium of claim 5, further comprising program code for fully charging the lead acid battery.

* * * * *